United States Patent
Liu et al.

(10) Patent No.: US 9,310,678 B2
(45) Date of Patent: Apr. 12, 2016

(54) VINYL ETHER GROUP-CONTAINING COPOLYMER, PREPARATION PROCESS AND USE THEREOF

(71) Applicant: BOE Technology Group Co., Ltd., Beijing (CN)

(72) Inventors: Lu Liu, Beijing (CN); Shi Shu, Beijing (CN); Yonglian Qi, Beijing (CN); Chuanxiang Xu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 16 days.

(21) Appl. No.: 14/103,301

(22) Filed: Dec. 11, 2013

(65) Prior Publication Data

US 2014/0170561 A1 Jun. 19, 2014

(30) Foreign Application Priority Data

Dec. 14, 2012 (CN) .......................... 2012 1 0546705

(51) Int. Cl.
| | | |
|---|---|---|
| *G03F 7/033* | (2006.01) | |
| *G03F 7/027* | (2006.01) | |
| *C08F 216/14* | (2006.01) | |
| *C08F 220/18* | (2006.01) | |
| *G03F 7/029* | (2006.01) | |
| *G03F 7/031* | (2006.01) | |
| *G03F 7/038* | (2006.01) | |

(52) U.S. Cl.
CPC .............. *G03F 7/027* (2013.01); *C08F 216/14* (2013.01); *C08F 216/1416* (2013.01); *C08F 220/18* (2013.01); *G03F 7/029* (2013.01); *G03F 7/031* (2013.01); *G03F 7/0388* (2013.01)

(58) Field of Classification Search
CPC .. G03F 7/033; C08F 216/14; C08F 216/1416; C08F 220/18
USPC ............... 430/287.1; 525/299, 301, 302, 313; 526/332, 319, 320
See application file for complete search history.

(56) References Cited

U.S. PATENT DOCUMENTS

| 6,916,595 B2 * | 7/2005 | Fujimaki et al. ........... 430/287.1 |
| 7,358,033 B2 * | 4/2008 | Araki ......................... 430/287.1 |

(Continued)

FOREIGN PATENT DOCUMENTS

| CN | 1376662 A | 10/2002 |
| CN | 1550506 A | 12/2004 |
| CN | 101613276 A | 12/2009 |

(Continued)

OTHER PUBLICATIONS

Second Chinese Office Action for Chinese Patent Application No. 201210546705.4, dated Sep. 24, 2014, 4 pages.

(Continued)

*Primary Examiner* — Amanda C Walke
(74) *Attorney, Agent, or Firm* — Westman, Champlin & Koehler, P.A.

(57) ABSTRACT

The invention provides a vinyl ether group-containing copolymer, preparation process and use thereof. The copolymer comprises of the structural units represented by the following general formulae I, II and III, wherein, $R^1$ is O or HN, $R^2$ is an alkyl group with a carbon atom number of 1-4, cyclohexyl or a group represented by the following general formula IV (m represents a positive integer of 1-3), n is a positive integer of 1-4, the molar numbers of the structural units represented by the general formulae I, II and III are x, y and z, respectively, and x:y:z=3-8:1-4:1-5, the weight average molecular weight of the copolymer is 5000-20000. A color light blocking agent added with the copolymer can increase sensitivity. Furthermore, the copolymer has solubility in an alkaline solution, and thus, the color light blocking agent added with the copolymer has a superior developing property.

2 Claims, No Drawings

(56) References Cited

U.S. PATENT DOCUMENTS

| | | | |
|---|---|---|---|
| 7,745,076 B2 * | 6/2010 | Araki | 430/7 |
| 2004/0236050 A1 | 11/2004 | Lundquist et al. | |

FOREIGN PATENT DOCUMENTS

| | | | |
|---|---|---|---|
| EP | 1 182 033 A1 | 2/2002 | |
| JP | 2007099881 A | * 4/2007 | |

OTHER PUBLICATIONS

First Chinese Office Action for Chinese Patent Application No. 201210546705.4, dated May 21, 2014, 9 pages.

Search Report for Chinese Patent Application No. 201210546705.4, dated May 13, 2014, 2 pages.

* cited by examiner

VINYL ETHER GROUP-CONTAINING COPOLYMER, PREPARATION PROCESS AND USE THEREOF

CROSS-REFERENCE TO RELATED APPLICATION

This Application is a non-provisional Application of Chinese Application No. CN 201210546705.4, filed Dec. 14, 2012 in Chinese, the contents of which are hereby incorporated by reference in their entirety.

FIELD OF THE INVENTION

The invention relates to a vinyl ether group-containing copolymer, the preparation process and use thereof.

BACKGROUND OF THE INVENTION

A color light blocking agent is mainly consisted of a pigment disperse liquid, an alkali soluble film-forming resin, a multi-functional monomer and a photo-initiator (see Chinese Patent Application CN101613276A). The methacrylic resin is a film-forming resin generally used in a color light blocking agent, and has high transparency and resolution. There are double bonds in a certain proportion on the side chain of the methacrylic resin, and thus, a polymerization under the action of a radical polymerization initiator may happen among the polymer chains, or a cross-linking reaction with small molecules may happen. Generally, the double bonds introduced are methacrylic double bonds and the polymerization thus happened is a radical polymerization. However, the radical polymerization is apt to be interfered by the polymerization inhibition of oxygen, resulting in the decreased sensitivity and poor developing property of the color light blocking agent sometimes.

SUMMARY OF THE INVENTION

In view of the above problem of the decreased sensitivity and poor developing property of the color light blocking agent, the present invention provides a vinyl ether group-containing copolymer, its preparation process, as well a color light blocking agent prepared using the same. The specific solutions are as follows.

A vinyl ether group-containing copolymer composed of the structural units represented by the following general formulae I, II and III,

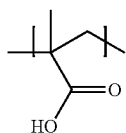

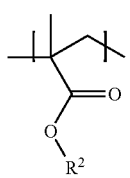

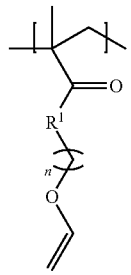

wherein, $R^1$ is O or HN, $R^2$ is an alkyl group with a carbon atom number of 1-4, cyclohexyl or a group represented by the following general formula IV, with methyl, ethyl or butyrolactone group being preferable,

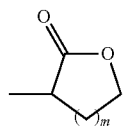

wherein m represents a positive integer of 1-3, n is a positive integer of 1-4, preferably, a positive integer of 2-4.

The molar numbers of the structural units represented by the general formulae I, II and III are x, y and z, respectively, and x:y:z=3-8:1-4:1-5, preferably, x:y:z=4-6:2-3:2-4.

The weight average molecular weight of the copolymer is 5000-20000, preferably, 14000-17000.

The copolymer may be a random copolymer or a block copolymer.

The process for preparing the above copolymer comprises the steps of:

(1) copolymerizing methacrylic acid, a methacrylate represented by the following general formula VI and methacryloyl chloride to obtain a copolymer 1;

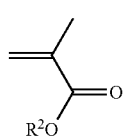

(2) adding a vinyl ether represented by the following general formula V into the copolymer 1 to obtain the vinyl ether group-containing copolymer,

wherein, $R^1$ is O or HN, $R^2$ is an alkyl group with a carbon atom number of 1-4, cyclohexyl or a group represented by the following general formula IV, in which m represents a positive integer of 1-3,

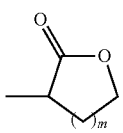

n is a positive integer of 1-4.

The above preparation process can be performed by reacting the methacrylic acid, the methacrylate represented by the general formula VI and the methacryloyl chloride in the presence of an initiator at 50-90° C. for 8-20 hours to obtain the copolymer 1, and then adding dropwise the vinyl ether represented by the general formula V into the copolymer 1 at 35-50° C. over 1-3 hours and reacting for 5-20 hours to obtain the copolymer of the invention.

The invention further relates to use of the above copolymer in the preparation of a color light blocking agent.

Furthermore, the invention relates to a color light blocking agent comprising the above vinyl ether group-containing copolymer.

Preferably, the color light blocking agent further comprises a radical polymerization initiator and a cationic polymerization initiator.

Wherein, the radical polymerization initiator is one or more selected from 1-hydroxycyclohexylphenylmethanone, 2-methyl-1-(4-methylthiophenyl)-2-morpholinyl-1-acetone, and 2-isopropylthiaanthracenone; and the cationic polymerization initiator is one or more selected from $AlCl_3$, $BF_3$, $SnCl_4$, PAG-201 (Changzhou Tronly Electronic Material Co. Ltd., with a maximal absorption wavelength of 301 nm), $ZnCl_2$ or $TiBr_4$.

In the vinyl ether group-containing copolymer of the invention, a vinyl ether type double bond, which can be subjected to polymerization in the presence of a radical polymerization initiator and a cationic polymerization initiator, is introduced into the side chain of the polymer. Because the cationic polymerization is not interfered by oxygen gas and the efficiency of polymerization is high, the color light blocking agent added with this copolymer can increase the sensitivity. Furthermore, because the copolymer of the invention comprises methacrylic acid units and thus has a certain degree of acidity, it is soluble in an alkaline solution. Therefore, the color light blocking agent added with the copolymer has a superior developing property. Additionally, the copolymer of the invention comprises a polar group, that is, a carboxyl group, which contributes to the adhesion of the film, and thus, the color light blocking agent added with the copolymer of the invention has a superior film-forming property. The copolymer of the invention comprises methacrylate units which contribute to the adjustment of the flexibility of the film. Moreover, the raw materials for the copolymer of the invention are simply available, the operation process is simple, and the cost is relatively low.

DETAILED DESCRIPTION OF THE INVENTION

The invention relates to a vinyl ether group-containing copolymer composed of the structural units represented by general formulae I, II and III,

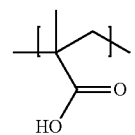

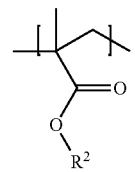

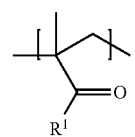

wherein, $R^1$ is O or HN, $R^2$ is an alkyl group with a carbon atom number of 1-4, cyclohexyl or a group represented by general formula IV (wherein, m represents a positive integer of 1-3, preferably, m is 1). The alkyl group with a carbon atom number of 1-4 includes methyl, ethyl, propyl, iso-propyl, butyl, iso-butyl, tert-butyl. Preferably, $R^2$ is methyl, ethyl or butyrolactone group.

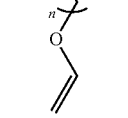

n is a positive integer of 1-4, preferably, a positive integer of 2-4.

The molar numbers of the structural units represented by the general formulae I, II and III are x, y and z, respectively, and x:y:z=3-8:1-4:1-5, preferably, x:y:z=4-6:2-3:2-4. The weight average molecular weight of the copolymer is 5000-20000, preferably, 14000-17000.

The copolymer may be a random copolymer or a block copolymer.

The process for preparing the above copolymer comprises the steps of:

(1) copolymerizing methacrylic acid, a methacrylate represented by general formula VI and methacryloyl chloride to obtain a copolymer 1;

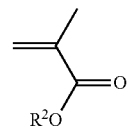

(2) adding a vinyl ether represented by general formula V into the copolymer 1 to obtain the vinyl ether group-containing copolymer,

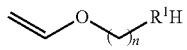

V wherein, $R^1$ is O or HN, $R^2$ is an alkyl group with a carbon atom number of 1-4, cyclohexyl or a group represented by general formula IV, in which m represents a positive integer of 1-3,

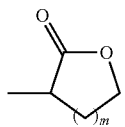

IV n is a positive integer of 1-4.

The solvent used in the preparation process may be one or more of dioxane, tetrahydrofuran, pyridine, dichloromethane, chloroform, toluene, acetone, acetonitrile, n-hexane or the like.

The above preparation process may be performed by reacting the methacrylic acid, the methacrylate represented by general formula VI and the methacryloyl chloride in the presence of an initiator at 50-90° C. for 8-20 hours to obtain the copolymer 1, and then adding dropwise the vinyl ether represented by general formula V into the copolymer 1 at 35-50° C. over 1-3 hours and reacting for 5-20 hours to obtain the vinyl ether group-containing copolymer.

The initiator can be one or more of azobisisobutyronitrile (AIBN), azobisisoheptylnitrile, dimethyl azodiisobutyrate, benzoyl peroxide, tert-butyl peroxybenzoate, methyl ethyl ketone peroxide, potassium persulfate, ammonium persulfate, and the like.

The invention further relates to use of the above copolymer in the preparation of a color light blocking agent.

Moreover, the invention further relates to a color light blocking agent comprising the above vinyl ether group-containing copolymer.

Preferably, the color light blocking agent further comprises a radical polymerization initiator and a cationic polymerization initiator.

Wherein, the radical polymerization initiator may be a radical polymerization initiator commonly used in the field, for example, one or more selected from 1-hydroxycyclohexylphenylmethanone (that is, the photo-initiator 184), 2-methyl-1-(4-methylthiophenyl)-2-morpholinyl-1-acetone (that is, the photo-initiator 907), and 2-isopropylthiaanthracenone (that is, the photo-initiator ITX). The cationic polymerization initiator may be a cationic polymerization initiator commonly used in the field, for example, one or more selected from $AlCl_3$, $BF_3$, $SnCl_4$, PAG-201, $ZnCl_2$ or $TiBr_4$.

Some examples are listed below to specifically illustrate the copolymer of the invention, however, the invention is not limited thereto. It should be noted that the infrared spectra in the invention is measured by using a 750× type infrared spectrometer of Nicolet Company, and the weight average molecular weight is measured according to GPC method.

Preparation of Vinyl Ether Group-Containing Copolymer

Example 1

Under the protection of nitrogen gas, 43.0 g (about 0.5 mol) of methacrylic acid, 20.0 g (about 0.2 mol) of methyl methacrylate, 31.4 g (about 0.3 mol) of methacryloyl chloride, 0.9 g of azobisisobutyronitrile and 1000 g of dioxane were added into a reaction container and heated to 50-90° C. (preferably, about 70° C.). After reacting for 8-20 h (preferably, about 12 h), 2-5 drops of hydroquinone as a polymerization inhibitor were added into the system. Then, the reaction system was cooled to a temperature of 35-50° C. (preferably, about 40° C.), and 0.3 mol of hydroxyethyl vinyl ether was added dropwise thereto over 1-3 h (preferably, about 2 hours). After the addition, the reaction was kept for about 10 h and then cooled down to room temperature. An aqueous methanol solution with a volume ratio of 1:1 was added into the reaction system to precipitate white powders. The mixture was filtrated using an air bump and the cake was dried in vacuo for 24 hours to obtain the vinyl ether group-containing copolymer of the invention.

In the copolymer, the ratio of the molar numbers of the structural units represented by general formulae I, II and III was 5:2:3, and the weight average molecular weight of the obtained copolymer was 16000. An absorption peak derived from the double bond vibration of the vinyl ether group could be observed at 1619 $cm^{-1}$ in the infrared spectroscopy (KBr) of the copolymer.

Example 2

Under the protection of nitrogen gas, 34.4 g (about 0.4 mol) of methacrylic acid, 34.2 g (about 0.3 mol) of ethyl methacrylate, 31.4 g (about 0.3 mol) of methacryloyl chloride, 1.0 g of azobisisobutyronitrile and 1200 g of dioxane were added into a reaction container and heated to about 90° C. After reacting for 15 h, 2-5 drops of hydroquinone as a polymerization inhibitor were added into the system. Then, the reaction system was cooled to a temperature of about 35° C., and 0.3 mol of hydroxyethyl vinyl ether was added dropwise thereto over about 1 h. After the addition, the reaction was kept for about 10 h and then cooled down to room temperature. An aqueous methanol solution with a volume ratio of 1:1 was added into the reaction system to precipitate white powders. The mixture was filtrated using an air bump and the cake was dried in vacuo for 24 hours to obtain the vinyl ether group-containing copolymer of the invention.

In the copolymer, the ratio of the molar numbers of the structural units represented by general formulae I, II and III was 4:3:3, and the weight average molecular weight of the obtained copolymer was 15500. An absorption peak derived from the double bond vibration of the vinyl ether group could be observed at 1617 $cm^{-1}$ in the infrared spectroscopy (KBr) of the copolymer.

Example 3

Under the protection of nitrogen gas, 43.0 g (about 0.5 mol) of methacrylic acid, 43.6 g (about 0.2 mol) of 2-cyclobutyl methacrylate, 31.4 g (about 0.3 mol) of methacryloyl chloride, 11.8 g of benzoyl peroxide and 945 g of dioxane were added into a reaction container and heated to about 50° C. After reacting for 20 h, 2-5 drops of hydroquinone as a polymerization inhibitor were added into the system. Then, the reaction system was cooled to a temperature of about 50° C., and 0.3 mol of hydroxyethyl vinyl ether was added dropwise thereto over about 3 h. After the addition, the reaction was kept for about 10 h and then cooled down to room temperature. An aqueous methanol solution with a volume ratio of 1:1 was added into the reaction system to precipitate white powders. The mixture was filtrated using an air bump and the cake was dried in vacuo for 24 hours to obtain the vinyl ether group-containing copolymer of the invention.

In the copolymer, the ratio of the molar numbers of the structural units represented by general formulae I, II and III was 5:2:3, and the weight average molecular weight of the obtained copolymer was 17000. An absorption peak derived from the double bond vibration of the vinyl ether group could be observed at 1619 cm$^{-1}$ in the infrared spectroscopy (KBr) of the copolymer.

Example 4

Under the protection of nitrogen gas, 34.4 g (about 0.4 mol) of methacrylic acid, 22.8 g (about 0.2 mol) of ethyl methacrylate, 41.8 g (about 0.4 mol) of methacryloyl chloride, 1.0 g of ammonium persulfate and 1000 g of tetrahydrofuran were added into a reaction container and heated to about 70° C. After reacting for 12 h, 2-5 drops of hydroquinone as a polymerization inhibitor were added into the system. Then, the reaction system was cooled to a temperature of about 40° C., and 0.4 mol of 2-aminoethyl vinyl ether was added dropwise thereto over about 2 h. After the addition, the reaction was kept for about 10 h and then cooled down to room temperature. An aqueous methanol solution with a volume ratio of 1:1 was added into the reaction system to precipitate white powders. The mixture was filtrated using an air bump and the cake was dried in vacuo for 24 hours to obtain the vinyl ether group-containing copolymer of the invention.

In the copolymer, the ratio of the molar numbers of the structural units represented by general formulae I, II and III was 4:2:4, and the weight average molecular weight of the obtained copolymer was 14000. An absorption peak derived from the double bond vibration of the vinyl ether group could be observed at 1619 cm$^{-1}$ in the infrared spectroscopy (KBr) of the copolymer.

Example 5

Under the protection of nitrogen gas, 51.7 g (about 0.6 mol) of methacrylic acid, 20.0 g (about 0.2 mol) of methyl methacrylate, 20.9 g (about 0.2 mol) of methacryloyl chloride, 0.9 g of azobisisobutyronitrile and 1000 g of dioxane were added into a reaction container and heated to about 50° C. After reacting for 15 h, 2-5 drops of hydroquinone as a polymerization inhibitor were added into the system. Then, the reaction system was cooled to a temperature of about 35° C., and 0.2 mol of hydroxybutyl vinyl ether was added dropwise thereto over 1-3 h (preferably, about 2 hours). After the addition, the reaction was kept for about 10 h and then cooled down to room temperature. An aqueous methanol solution with a volume ratio of 1:1 was added into the reaction system to precipitate white powders. The mixture was filtrated using an air bump and the cake was dried in vacuo for 24 hours to obtain the vinyl ether group-containing copolymer of the invention.

In the copolymer, the ratio of the molar numbers of the structural units represented by general formulae I, II and III was 6:2:2, and the weight average molecular weight of the obtained copolymer was 14600. An absorption peak derived from the double bond vibration of the vinyl ether group could be observed at 1618 cm$^{-1}$ in the infrared spectroscopy (KBr) of the copolymer.

Example 6

Under the protection of nitrogen gas, 51.6 g (about 0.6 mol) of methacrylic acid, 33.6 g (about 0.2 mol) of cyclohexyl methacrylate, 21.0 g (about 0.2 mol) of methacryloyl chloride, 0.9 g of azobisisobutyronitrile and 1000 g of dioxane were added into a reaction container and heated to about 70° C. After reacting for 8 h, 2-5 drops of hydroquinone as a polymerization inhibitor were added into the system. Then, the reaction system was cooled to a temperature of about 40° C., and 0.2 mol of hydroxyethyl vinyl ether was added dropwise thereto over about 3 h. After the addition, the reaction was kept for about 10 h and then cooled down to room temperature. An aqueous methanol solution with a volume ratio of 1:1 was added into the reaction system to precipitate white powders. The mixture was filtrated using an air bump and the cake was dried in vacuo for 24 hours to obtain the vinyl ether group-containing copolymer of the invention.

In the copolymer, the ratio of the molar numbers of the structural units represented by general formulae I, II and III was 3:1:1, and the weight average molecular weight of the obtained copolymer was 5000. An absorption peak derived from the double bond vibration of the vinyl ether group could be observed at 1618 cm$^{-1}$ in the infrared spectroscopy (KBr) of the copolymer.

Example 7

Under the protection of nitrogen gas, 32.6 g (about 0.38 mol) of methacrylic acid, 50.0 g (about 0.5 mol) of methyl methacrylate, 12.6 g (about 0.12 mol) of methacryloyl chloride, 1.1 g of azobisisobutyronitrile and 1000 g of dioxane were added into a reaction container and heated to about 80° C. After reacting for about 15 h, 2-5 drops of hydroquinone as a polymerization inhibitor were added into the system. Then, the reaction system was cooled to a temperature of 35° C., and 0.12 mol of hydroxyethyl vinyl ether was added dropwise thereto over about 1 h. After the addition, the reaction was kept for about 10 h and then cooled down to room temperature. An aqueous methanol solution with a volume ratio of 1:1 was added into the reaction system to precipitate white powders. The mixture was filtrated using an air bump and the cake was dried in vacuo for 24 hours to obtain the vinyl ether group-containing copolymer of the invention.

In the copolymer, the ratio of the molar numbers of the structural units represented by general formulae I, II and III was 3:4:1, and the weight average molecular weight of the obtained copolymer was 17000. An absorption peak derived from the double bond vibration of the vinyl ether group could be observed at 1619 cm$^{-1}$ in the infrared spectroscopy (KBr) of the copolymer.

Example 8

Under the protection of nitrogen gas, 49.0 g (about 0.57 mol) of methacrylic acid, 7.0 g (about 0.07 mol) of methyl methacrylate, 37.6 g (about 0.36 mol) of methacryloyl chloride, 0.9 g of azobisisobutyronitrile and 1000 g of dioxane were added into a reaction container and heated to 90° C. After reacting for 20 h, 2-5 drops of hydroquinone as a polymerization inhibitor were added into the system. Then, the reaction system was cooled to a temperature of 40° C., and 0.36 mol of hydroxyethyl vinyl ether was added dropwise thereto over about 1 h. After the addition, the reaction was kept for about 10 h and then cooled down to room temperature. An aqueous methanol solution with a volume ratio of 1:1 was added into the reaction system to precipitate white powders. The mixture was filtrated using an air bump and the cake was dried in vacuo for 24 hours to obtain the vinyl ether group-containing copolymer of the invention.

In the copolymer, the ratio of the molar numbers of the structural units represented by general formulae I, II and III was 8:1:5, and the weight average molecular weight of the obtained copolymer was 16500. An absorption peak derived from the double bond vibration of the vinyl ether group could be observed at 1619 cm$^{-1}$ in the infrared spectroscopy (KBr) of the copolymer.

Example 9

Under the protection of nitrogen gas, 40.4 g (about 0.47 mol) of methacrylic acid, 24.0 g (about 0.24 mol) of methyl methacrylate, 30.3 g (about 0.29 mol) of methacryloyl chloride, 1.0 g of azobisisobutyronitrile and 1000 g of dioxane were added into a reaction container and heated to about 50° C. After reacting for about 12 h, 2-5 drops of hydroquinone as a polymerization inhibitor were added into the system. Then, the reaction system was cooled to a temperature of 35-50° C. (preferably, about 40° C.), and 0.29 mol of hydroxyethyl vinyl ether was added dropwise thereto over 1-3 h (preferably, about 2 hours). After the addition, the reaction was kept for about 10 h and then cooled down to room temperature. An aqueous methanol solution with a volume ratio of 1:1 was added into the reaction system to precipitate white powders. The mixture was filtrated using an air bump and the cake was dried in vacuo for 24 hours to obtain the vinyl ether group-containing copolymer of the invention.

In the copolymer, the ratio of the molar numbers of structural units represented by general formulae I, II and III was 8:4:5, and the weight average molecular weight of the obtained copolymer was 20000. An absorption peak derived from the double bond vibration of the vinyl ether group could be observed at 1620 cm$^{-1}$ in the infrared spectroscopy (KBr) of the copolymer.

Comparative Example 1

Under the protection of nitrogen gas, 43.0 g (about 0.5 mol) of methacrylic acid, 20.0 g (about 0.2 mol) of methyl methacrylate, 35.4 g (about 0.3 mol) of hydroxyethyl methacrylate, 0.9 g of azobisisobutyronitrile and 1000 g of dioxane were added into a reaction container and heated to about 70° C. After reacting for 12 h, the reaction system was cooled down to room temperature. An aqueous methanol solution with a volume ratio of 1:1 was added into the reaction system to precipitate white powders. The mixture was filtrated using an air bump and the cake was dried in vacuo for 24 hours to obtain the methacrylic copolymer of comparative example 1.

In the copolymer, the ratio of the molar numbers of methacrylic acid, methyl methacrylate, and hydroxyethyl methacrylate was 5:2:3, and the weight average molecular weight of the obtained copolymer was 14300.

Measurement of Acid Value 0.5-3 g of a sample was weighted with an accuracy of 1 mg and placed into an Erlenmeyer flask. 50 ml of a toluene-absolute methanol (with a volume ratio of 1:1) mixed solvent was sucked with a transfer pipette and put into the Erlenmeyer flask. The Erlenmeyer flask was shaken until the sample was dissolved completely. The solution was cooled to room temperature and added with 5 drops of an indicator (0.1% solution of phenolphthalein in absolute ethanol). The Erlenmeyer flask was placed on a magnetic stirring device and titrated with a potassium hydroxide-ethanol standard solution until the solution changed to pink and this color kept for 20 s-30 s without disappearing, which is regarded as the end point. The volume of the potassium hydroxide-ethanol standard solution consumed was recorded to calculate the acid value.

$$Av = 56.1 * (V_1 - V_2) * c / m$$

Av: the acid value of the copolymer, mgKOH/g
$V_1$: the volume (ml) of the potassium hydroxide-ethanol standard solution consumed when the sample was tested
$V_2$: the volume (ml) of the potassium hydroxide-ethanol standard solution consumed when a blank was tested
c: the molar concentration (mol/L) of the potassium hydroxide-ethanol standard solution
m: the mass (g) of the sample The acid values of the vinyl ether group-containing copolymers obtained in Examples 1-9 and the acid value of the copolymer of comparative example 1 were shown in table 1.

TABLE 1

| | Example | | | | | | | | | Comparative |
|---|---|---|---|---|---|---|---|---|---|---|
| | Example 1 | Example 2 | Example 3 | Example 4 | Example 5 | Example 6 | Example 7 | Example 8 | Example 9 | Example 1 |
| Acid value (mgKOH/g) | 168 | 129 | 160 | 132 | 195 | 193 | 124 | 190 | 155 | 170 |

Preparation of Color Light Blocking Agent

According to the compositions and contents as shown in the below Table 2, various materials were weighted, placed into a stirring machine and mixed and dispersed for about 10 hours. The mixture was filtered using a filtering film with a pore diameter of 0.2 μm to obtain a filtrate, that is, the color light blocking agent.

It should be noted that the pigment used in the above color light blocking agent can be other pigments commonly used in the field, such as, CI Pigment Yellow, CI Pigment Orange, CI Pigment Violet, or the like. With regard to the multi-functional monomer, other compounds containing two or more double bonds commonly used in the field, such as, ethylene glycol dimethacrylate or the like, can also be used. The solvent used in the color light blocking agent can be the solvents commonly used, such as, tetrahydrofuran, cyclohexanone, N,N-dimethylformamide, ethylene glycol ethyl ether acetate, acetone, propylene glycol methyl ether acetate, or the like. The above solvents can be used alone, or used in a combination of two or more.

Next, the color light blocking agent was spin-coated on a silicon wafer, a glass or the like using a gluing machine to form a color light blocking agent layer. The film was subjected to pre-baking at 70° C. for 30 min, exposing, developing at 23° C. for 30 s, and post baking at 120° C. for 30 min in turn. Finally, the exposed color light blocking agent layer was developed. As a developer for the developing process, there can be used an alkaline developer, including a 0.1-10 wt % aqueous solution of an alkaline compound such as sodium hydroxide, potassium hydroxide, sodium carbonate, tetramethyl ammonium hydroxide, or the like.

Measurement of Sensitivity

Using the above exposing and developing method, the minimal exposing amount required for obtaining a 20 μm pattern using the above color light blocking agent was measured, which was regarded as the sensitivity of the color light blocking agent.

Evaluation for Film-Forming Property

Firstly, a color light blocking agent was coated onto a silicon wafer using a gluing machine to form a color light blocking agent layer. The sample was pre-baked at 90° C. for 60 s and weighted using an analytical balance under a shading condition to obtain W1. The silicon wafer was dipped in a 2.38 wt % tetramethyl ammonium hydroxide solution at 23° C. for 60 s, washed with water, dried and weighted to obtain W2. Then, the residual color light blocking agent was removed by washing, and the washed sample was dried and weighted to obtain W3. A residual film ratio was calculated according to the following formula. When the residual film ratio of the color light blocking agent was 95% or more, the film-forming property thereof was superior; when the residual film ratio of the color light blocking agent was 85 or more and less than 95%, the film-forming property thereof was common.

Residual film ratio=$(W2-W3)/(W1-W3)*100\%$

TABLE 2

| Color light blocking agent | Copolymer (g) | Initiator (g) | Pigment (g) | Multi-functional monomer (g) | Solvent (g) | Sensitivity (mJ/cm$^2$) | Film-forming property |
|---|---|---|---|---|---|---|---|
| Example 10 | Example 1 (6 g) | 907/PAG 201 = 5:1 (1.2 g) | CI Pigment Red 168 (6 g) | DPHA (1 g) | Tetrahydrofuran (42 g) | 127 | Superior |
| Example 11 | Example 2 (6 g) | 907/PAG 201 = 5:1 (1.2 g) | CI Pigment Red 168 (6 g) | DPHA (1 g) | Tetrahydrofuran (42 g) | 132 | Superior |
| Example 12 | Example 3 (6 g) | 907/PAG 201 = 6:1 (1.2 g) | CI Pigment Red 168 (6 g) | DPHA (1 g) | Propylene glycol methyl ether acetate (42 g) | 135 | Superior |
| Example 13 | Example 4 (6 g) | 907/PAG 201 = 4:1 (1.2 g) | CI Pigment Red 168 (6 g) | DPHA (1 g) | Cyclohexanone (42 g) | 139 | Common |
| Example 14 | Example 5 (6 g) | 907/PAG 201 = 5:1 (1.2 g) | CI Pigment Red 168 (6 g) | DPHA (1 g) | Tetrahydrofuran (42 g) | 130 | Superior |
| Example 15 | Example 6 (6 g) | 907/PAG 201 = 5:1 (1.2 g) | CI Pigment Red 168 (6 g) | DPHA (1 g) | Tetrahydrofuran (42 g) | 146 | Superior |
| Example 16 | Example 7 (6 g) | 907/PAG 201 = 5:1 (1.2 g) | CI Pigment Red 168 (6 g) | DPHA (1 g) | Tetrahydrofuran (42 g) | 170 | Superior |
| example 17 | Example 8 (6 g) | ITX/BF$_3$ = 4:1 (1.2 g) | CI Pigment Red 168 (6 g) | DPHA (1 g) | Propylene glycol methyl ether acetate (42 g) | 153 | Common |
| example 18 | Example 9 (6 g) | 184/PAG 201 = 6:1 (1.2 g) | CI Pigment Red 168 (6 g) | DPHA (1 g) | Tetrahydrofuran (42 g) | 158 | Superior |
| Comparative Example 2 | Comparative Example 1 (6 g) | 907/AlCl$_3$ = 5:1 (1.2 g) | CI Pigment Red 168 (6 g) | DPHA (1 g) | Propylene glycol methyl ether acetate (42 g) | 350 | Superior |

Note:
DPHA bipentaerythritol penta/hexaacrylate;
PAG 201 (Changzhou Tronly Electronic Material Co. Ltd., with a maximal absorption wavelength of 301 nm)

As seen from Table 2, the color light blocking agent obtained by using the vinyl ether group-containing copolymer of the invention has excellent sensitivity, and the film-forming property thereof is superior in general.

Obviously, those skilled in the art can make various modifications and changes to the invention without departing from the spirit and scope of the invention. Thus, if these modifications and changes fall into the scope of the claims attached and the equivalents thereof, the invention also intends to comprise these modifications and changes.

What is claimed is:

1. The process for preparing a vinyl ether group-containing copolymer wherein the copolymer is composed of the structural units represented by the following general formulae I, II and III,

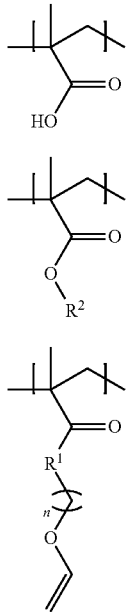

wherein $R^1$ is O or HN, $R^2$ is an alkyl group with a carbon atom number of 1-4, cyclohexyl or a group represented by the following general IV, in which m represents a positive integer of 1-3,

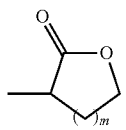

n is a positive integer of 1-4, the molar numbers of the structural units represented by the general formulae I, II and III are x, y and z, respectively, and x:y:z=3-8:1-4:1-5, and the weight average molecular weight of the copolymer is 5000-20000, the process comprises the steps of:
(1) copolymerizing methacrylic acid, a methacrylate represented by the following general formula VI and methacryloyl chloride to obtain a copolymer 1;

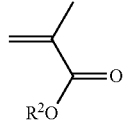

(2) adding a vinyl ether represented by the following general formula V into the copolymer 1 to obtain the vinyl ether group-containing copolymer,

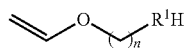

wherein $R^1$ is O or HN, $R^2$ is an alkyl group with a carbon atom number of 1-4, cyclohexyl or a group represented by the following general formula IV, in which m represents a positive integer of 1-3,

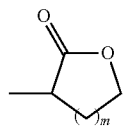

n is a positive integer of 1-4, wherein the step (1) is performed by reacting methacrylic acid, the methacrylate represented by the general formula VI and methacryloyl chloride, in the presence of an initiator, at 50-90° C. for 8-20 hours to obtain the copolymer 1; and the step (2) is performed by adding dropwise the vinyl ether represented by the general formula V into the copolymer 1 at 35-50° C. over 1-3 hours and then reacting for 5-20 hours to obtain the vinyl ether group-containing copolymer.

2. The copolymer process according to claim 1, wherein the initiator in the process is one or more selected from azobisisobutyronitrile, azobisisoheptylnitrile, dimethyl azodiisobutyrate, benzoyl peroxide, tert-butyl peroxybenzoate, methyl ethyl ketone peroxide, potassium persulfate, ammonium persulfate.

* * * * *